United States Patent [19]
Palmer et al.

[11] Patent Number: 6,061,228
[45] Date of Patent: May 9, 2000

[54] MULTI-CHIP MODULE HAVING AN INTEGRAL CAPACITOR ELEMENT

[75] Inventors: Edward G. Palmer, Melbourne; Charles M. Newton, Palm Bay, both of Fla.

[73] Assignee: Harris Corporation, Palm Bay, Fla.

[21] Appl. No.: 09/067,606

[22] Filed: Apr. 28, 1998

[51] Int. Cl.[7] .............................. H01G 4/228; H01G 4/06
[52] U.S. Cl. ...................... 361/306.2; 361/361; 361/311
[58] Field of Search ............................ 361/306.2, 306.3, 361/311–313, 321.1–321.5, 329, 728, 729

[56] References Cited

U.S. PATENT DOCUMENTS

| | | | |
|---|---|---|---|
| 4,622,619 | 11/1986 | Schilling et al. | 361/306.2 |
| 4,771,362 | 9/1988 | Behn | 361/323 |
| 5,134,539 | 7/1992 | Tuckerman et al. | 361/311 |
| 5,160,907 | 11/1992 | Nakajima et al. | 333/246 |
| 5,384,434 | 1/1995 | Mandei et al. | 174/258 |
| 5,583,739 | 12/1996 | Yu et al. | 361/313 |
| 5,625,528 | 4/1997 | Devoe et al. | 361/321.1 |
| 5,811,868 | 9/1998 | Bertin et al. | 257/516 |

*Primary Examiner*—Kristine Kincaid
*Assistant Examiner*—Anthony Dinkins
*Attorney, Agent, or Firm*—Allen, Dyer, Doppelt, Milbrath & Gilchrist, P.A.

[57] ABSTRACT

A multi-chip module has an integral capacitor element embedded within the substrate and includes a plurality of substrate layers forming a multi-chip module substrate. The substrate has a cut edge and forms at the cut edge a bondable edge. A via is formed in the substrate, and a dielectric capacitive material fills the via for a plurality of substrate layers and defines a multilayer capacitor. The multilayer capacitor and via are positioned at the bondable edge and connects to the bondable edge. In one aspect, the via having the dielectric capacitive material is positioned at the cut edge, and includes a conductive material filling at least a portion of the cut via to form the bondable edge. The dielectric capacitive material and bondable edge form a junction surface. A signal trace can be formed on a substrate layer and connected to the capacitor to form a DC blocking capacitor structure. A ground line can be formed on one substrate layer and engage the capacitive material. A signal trace can be formed on one of the substrate layers and engage the bondable edge to define a decoupling capacitor structure.

46 Claims, 5 Drawing Sheets

MULTI-CHIP MODULE HAVING AN INTEGRAL CAPACITOR ELEMENT

FIELD OF THE INVENTION

This invention relates to the field of multilayer capacitor elements, and more particularly, to a multi-chip module having an integral multilayer capacitor element formed in the module substrate.

BACKGROUND OF THE INVENTION

Analog signal processor modules (ASPM) typically connect to an analog video substrate. The analog signal processor module requires low cross-talk between 20 MHZ analog signals, high (44 MHZ) and low speed clock line interconnections, and power and ground connections. Typically, as shown in the prior art of FIG. 1, the capacitors associated with this type of prior art interconnection are placed several inches away from the bond pad because of the straight mechanical layout and configuration requirements, as well as design limitations associated with this type of module. Because the capacitors are so remote from a bond pad, and typically formed as a discrete component, they are less effective in performing their desired functions. These capacitors also take up valuable substrate real estate that could be used for active components, as well as make reduction in current module size difficult.

As shown in prior art FIG. 1, an analog signal processor module includes a capacitor and a focal plane array (FPA) structure. The components are surface mounted on the analog signal processor module and a CCD substrate positioned on the focal plane structure. These type of applications are used with phased array antenna transmit/receive modules and typically include low temperature co-fired ceramic (LTCC) circuit applications.

Other applications attempt to overcome the drawback of using discrete components, and instead use conventional buried capacitor structures or "planar" capacitors such as used in traditional multi-chip module interconnections. In order to place bond pads closer to some of these capacitors, substrates have been designed to allow edge metallization by exposing solid internal vias formed in the ceramic. These types of structures typically have used discrete captive elements. The capacitor positioning problem also has not been solved with these systems.

SUMMARY OF THE INVENTION

It is therefore an object of the present invention to provide a multi-chip module substrate using an edge bond with an integral capacitive element in or near the bond pad to provide coupling/decoupling, filtering or DC blocking capacitive structures.

It is still another object of the present invention to provide an embedded capacitor structure in a multi-chip module that includes an edge coupled point of contact for the module.

In accordance with the present invention, a multi-chip module has an integral capacitor element and includes a plurality of substrate layers forming a multi-chip module substrate. At least one via is formed in the substrate. A conductive material fills a portion of the via and a dielectric capacitive material fills the via for a plurality of substrate layers and engages the conductive material within the via to define a multilayer capacitor. The substrate has a cut edge that extends through at least a portion of the via for exposing the conductive material that fills the via to define a bondable edge.

In one aspect of the present invention, the cut edge extends through the via off-center to aid in retaining the conductive material within the via. The cut edge extends through the capacitive material to form an exposed edge of the capacitive material. A cap structure can be positioned on the exposed edge of the capacitive material.

In still another aspect of the present invention, the conductive material fills the via around the capacitive material. A signal trace can be formed on one of the substrate layers and engages the conductive material within the via. The conductive material filling the via can preferably comprise a gold and glass binder. In still another aspect of the present invention, the layers are formed from ceramic. A ground line can also be formed on one of the layers to engage the capacitive material.

In still another aspect of the present invention, the capacitive material comprises a high K dielectric material. The high K dielectric material has about a 10,000 to about 20,000K dielectric. The high K dielectric, in still another aspect, can have about a 100,000 to about 200,000K dielectric. The cut edge defining the bondable edge can be about eight mil square.

In still another aspect of the present invention, the multi-chip module has an integral capacitor element. A plurality of substrate layers form a multi-chip module substrate and the formed substrate has a cut edge. A via is formed in the substrate adjacent to the cut edge. A dielectric capacitive material fills the via for a plurality of substrate layers and defines a multilayer capacitor. Means is formed on the cut edge and defines a bondable edge. Means electrically interconnects the bondable edge and capacitive material and means connects at least two layers of the dielectric capacitive material.

In yet another aspect of the present invention, the means connecting at least two layers of the dielectric capacitive material comprises a conductive via. The capacitor defines an upper and lower portion within the via. A signal trace is formed on a substrate layer and is connected to one of either upper or lower portions of the capacitor to form a DC blocking capacitor structure. A ground line can also be formed on one of the substrate layers and connected to one of either upper or lower portions of the capacitor, while a signal trace can be formed on one of the substrate layers to engage the bondable edge to define a decoupling capacitor structure.

A post-fired bond pad can be formed on the bondable edge. However, in accordance with a preferred aspect of the present invention, the means formed on the cut edge and defining a bondable edge comprises a solid conductive via that has been cut to expose the solid conductive material forming the conductive via. The solid conductive via has preferably been cut off-center to aid in retaining the conductive material within the cut conductive via.

In a method aspect of the present invention, the method comprises the step of forming a multi-chip module having an integral capacitor element and comprises the steps of forming a plurality of substrate layers to form a multi-chip module substrate. The method further comprises forming a via within the substrate and filling the via with a dielectric capacitive material for a plurality of substrate layers to define a multilayer capacitor. The method further comprises the step of cutting the substrate to form a bonding surface that engages the dielectric capacitive material.

In accordance with the present method of the invention, the method further comprises the step of positioning the via having the dielectric capacitive material at the cut edge and including the step of filling at least a portion of the via with a conductive material to form the bondable surface. The method also comprises the step of forming a signal trace on one of the substrate layers and interconnecting the capacitor to form a DC blocking capacitor structure. The method also comprises the step of forming a ground line on one of the substrate layers and interconnecting the capacitor with the ground line. The method further comprises the step of forming a signal trace on one of the layers and engaging the bondable edge to define a decoupling capacitor structure. The method further comprises the step of forming a post-fired bond pad at the bondable edge. The method further comprises the step of forming a conductive via that has been cut to expose the conductive material to define the bondable edge.

The via is preferably formed off-center to aid in retaining the conductive material within the via. The capacitive material can be formed to form an exposed edge of the capacitive material, which can include a cap structure on the exposed edge. The via is preferably filled with a gold and glass binder.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous because it now allows a high K dielectric material to be used as a multilayer, embedded capacitor structure in a semiconductor substrate in or near edge metallization to provide coupling/decoupling, filtering or DC blocking capacitors. Thus, the present invention eliminates the need for any discrete capacitors on the surface of the substrate and allows for increased packing density. Many prior art devices have discrete capacitor and other similar devices to perform these functions. These devices include capacitors requiring a surface area on the substrate to accommodate the component, as well as attachment pads and routing traces. With the elimination of these types of discrete components, higher semiconductor packaging densities can be realized and improved electrical performance can be gained with close proximity of the embedded capacitor and other structures to the signal interface, i.e., the bondable surface providing a bond pad.

Figure 1:
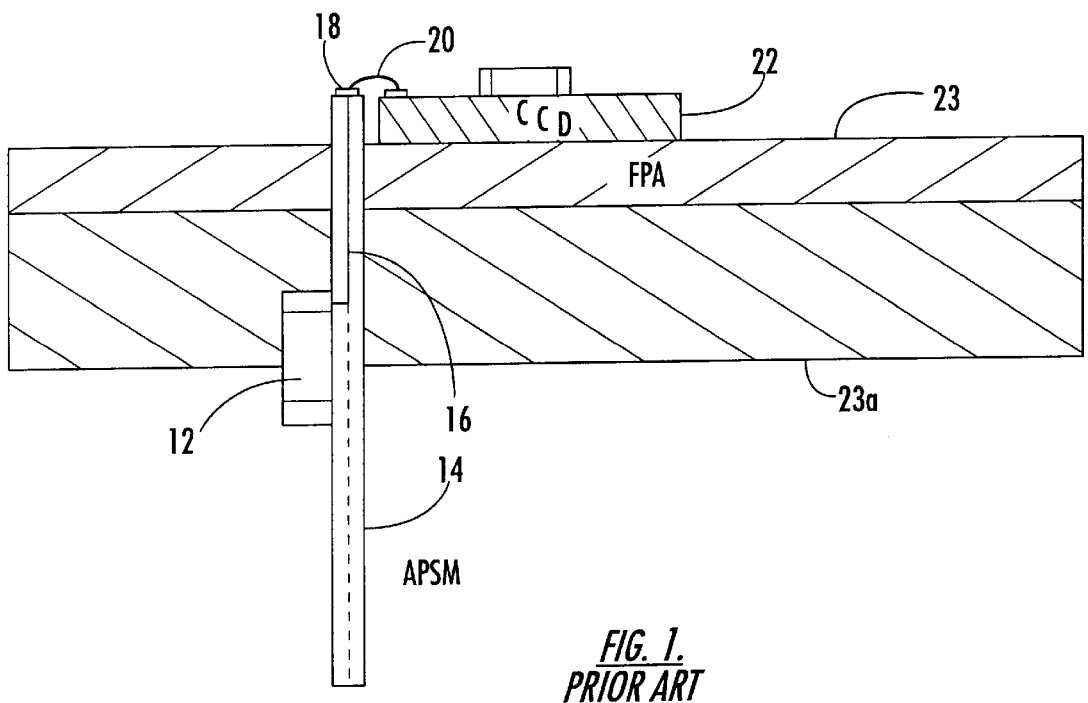
FIG. 1 is a schematic elevation view of a prior art analog signal processor module and focal plane array structure having a conventional capacitor mounted on the analog signal processor module and separated from the bond pad and CCD substrate.

FIG. 1 illustrates a prior art LTCC structure 10 having a discrete capacitor 12 mounted on an analog signal processor module (ASPM) 14. As illustrated, the discrete capacitor 12 has a lead connected to a signal trace 16 or conductor path extending through the analog signal processor module 14. The trace 16 is formed such as by printing the trace on a green tape ceramic sheet that forms a substrate after stacking the sheets and firing. An attachment bond pad 18 includes a lead wire 20 that connects to a CCD substrate 22 positioned on top of a focal plane array (FPA) 23 and substrate 23a. It is clearly evident that this prior art discrete capacitor 12 shown in FIG. 1 positions the discrete capacitor at a distance from the ASPM edge and also requires an attachment, bond pad 18, routing traces (i.e., the signal trace 16), and lead wire 20.

Figure 2:
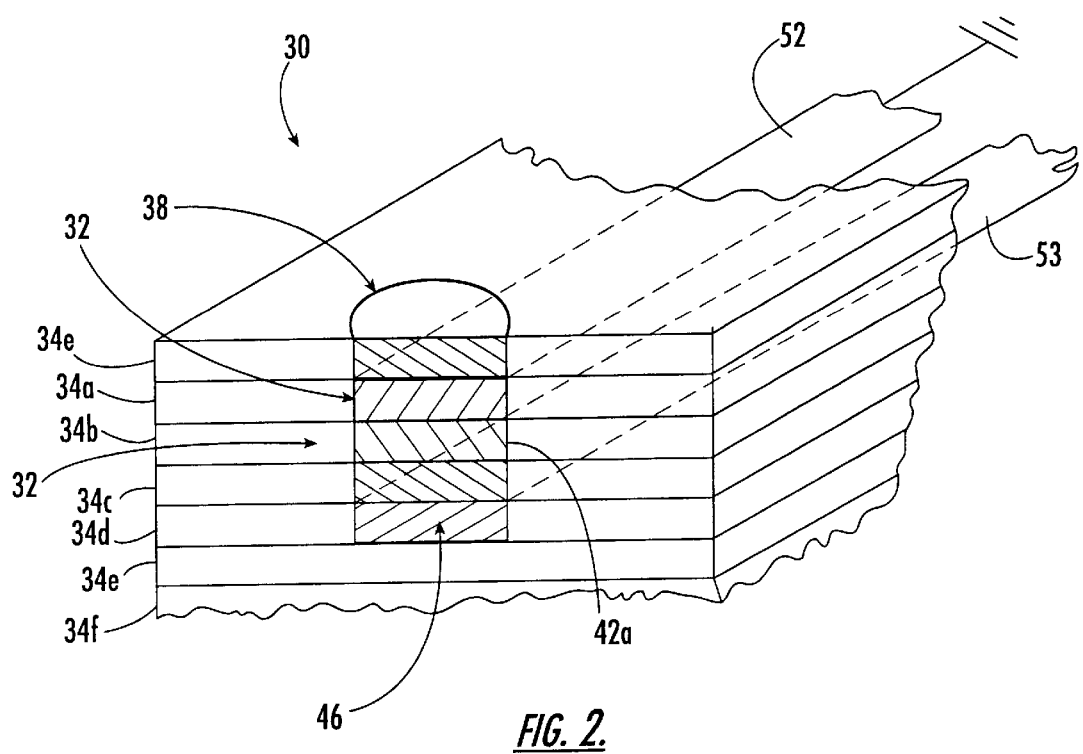
FIG. 2 is a schematic isometric view of a multi-chip module of the present invention and showing an embedded capacitor formed integral with the bondable edge surface forming an edge bond pad.

In accordance with the present invention, the discrete capacitor 12, the attachment bond pad 18 and routing traces 16 as shown in FIG. 1 are eliminated. As shown in FIG. 2, the multi-chip module 30 of the present invention has an integrally formed and embedded multilayer capacitor element 32, such as the integrally formed structure shown in FIGS. 2 and 3. The multi-chip module includes other elements and structures shown by a dotted line configuration at 31 (FIG. 3), as known to those skilled in the art. Drawings 2–5 only depict details of a portion of the multi-chip module relating to the embedded capacitor of the present invention.

A plurality of substrate layers 34a, 34b, 34c, 34d, 34e, 34f, and 34g form a multilayer module substrate 36. Typically, the layers are initially formed from sheets of ceramic green tape that have been manufactured by methods known to those skilled in the art. The layers formed from the green tape ceramic sheets are then processed individually before being placed together, and the circuit connections, as well as signal traces and ground lines, are printed on the green tape ceramic sheets by the conventional methods known to those skilled in the art. Although green tape ceramic sheets are preferably used in the present invention, any other material used as a multi-chip module substrate by those known to be skilled in the art could form from substrate layers.

Figure 3:
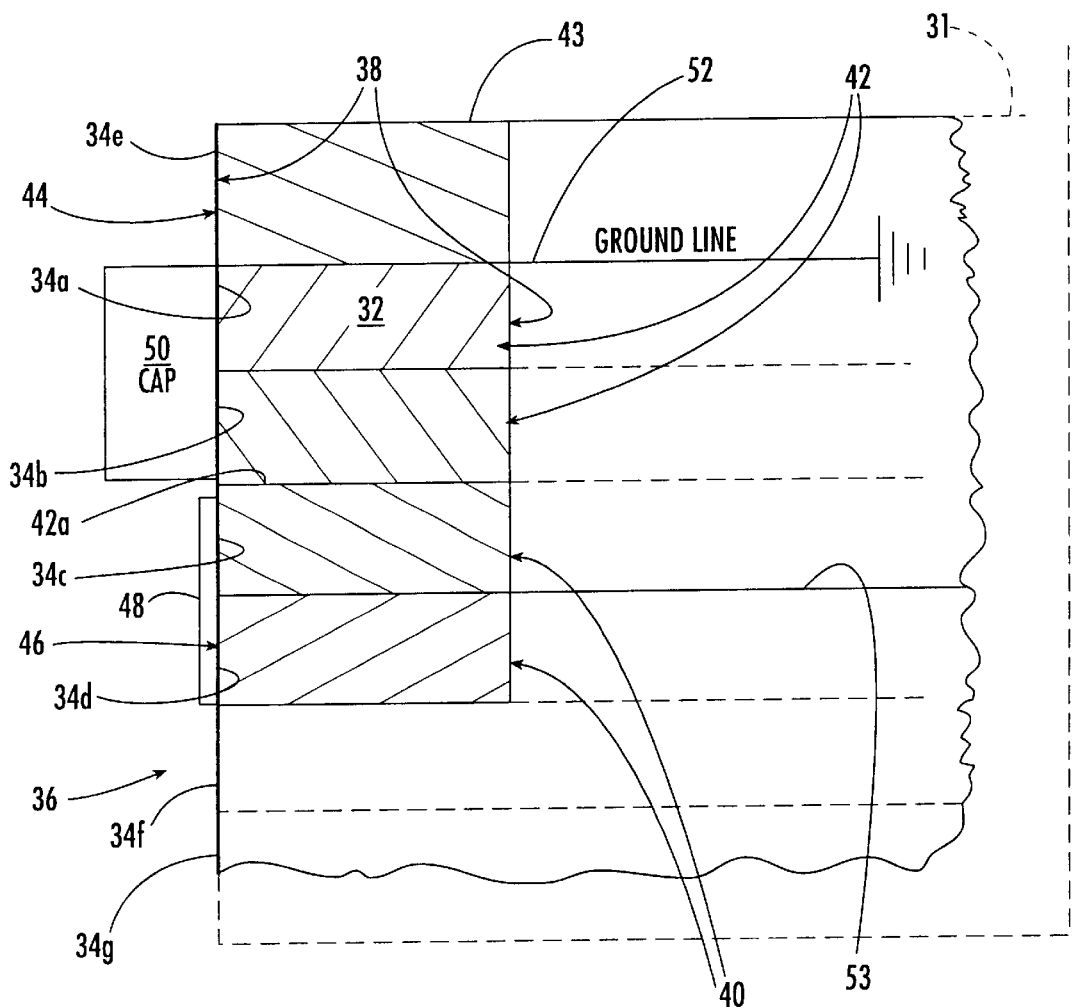
FIG. 3 is a schematic sectional view of a multi-chip module of the present invention and showing a via that is filled with conductive material and high K dielectric material to form the integral embedded capacitor.
Figure 6:
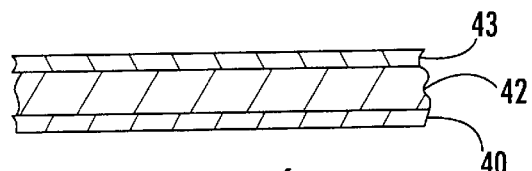
FIG. 6 is a schematic cross-section of a capacitor structure showing two plates on either side of the dielectric via.

In accordance with the present invention, and as shown in FIGS. 2 and 3, at least one via 38 is formed in the substrate 36, and formed by a laser or other drill mechanism. A conductive material 40 fills a portion of the via as shown in FIG. 2, in this instance, two layers 34c, 34d. The conductive material 40 can be formed from a gold and glass binder, which fills the conductive via for two substrate layers as illustrated. Other conductive materials, as suggested by those skilled in the art, can also be used. Additionally, two or more layers of conductive material can be used depending on the actual number of substrate layers and the desired end use of the module. A dielectric capacitive material 42 fills the via 38 for a plurality of layers 34a, 34b (two layers in the instance) and engages the conductive material 40 within the via 38 at a junction surface 42a to define a multilayer capacitor 32. A metallic layer 43 or other conductive material is preferably positioned on top of the formed capacitor 32 so that the "via" capacitor 38 structure as shown in FIG. 6 has the dielectric capacitive material 42 surrounded on both sides by a conductive material.

In accordance with the present invention, the dielectric capacitive material 42 preferably comprises a high K dielectric material that is about 10,000K to about 20,000K dielectric. The dielectric material can also have as high as 100,000 to about 200,000K dielectric depending on the end use and design configurations of the module.

Although only two layers of dielectric capacitive material are illustrated in FIGS. 2 and 3, it should be understood that additional layers can also be added depending on the design options to form various capacitor features.

During the manufacturing of the multi-chip module, its many vias and associated capacitors and other component devices can be formed as necessary depending on the final design of the product. Green tape ceramic sheets can also be cut into various sized sheets as necessary for forming any module substrates.

During processing, the substrate formed from the stacked green tape ceramic sheet is cut to form a cut edge 44 that extends through at least a portion of the via 38 for exposing at least the conductive material 40 filling the via. As a result of the cut edge 44, a rectangular slice of conductive material is exposed to define a bondable edge 46 that can receive a bond pad 48 such as by soldering, or by another attachment mechanism, including a conductive epoxy. It is evident, as shown in the embodiment of FIGS. 2 and 3, that the capacitive material 42 is also exposed by the cut edge 44 to form an exposed edge that can receive a cap structure 50. The cap structure 50 acts as an insulator material to protect the exposed edge of the capacitive material from damage. In accordance with one aspect of the invention, the cut edge 44 extends through the via off-center (FIG. 2), such that a majority of the capacitive material and conductive material is still retained in the via 38 to aid in retaining the conductive material and capacitive material within the via 38.

As shown in the embodiment of FIG. 3, during initial processing of the green tape ceramic sheets, a signal trace is printed that engages the conductive material. The fourth substrate layer 34a includes a ground line 52 such as formed by printing a trace on the ceramic green tape sheet. This ground line 52 engages the dielectric capacitive material to form a final structure having a bondable edge that is positioned adjacent the embedded capacitor. A conductor line or trace 53 extends off of the conductor material. Tables 1 and 2 illustrate various capacitor values with a K of 10,000 and 18,000 respectively. The charts illustrate the efficiency and design of the structure of the present invention.

TABLE 1

| dK = 10,000 | | | | | |
|---|---|---|---|---|---|
| C | 100 | 100 | 100 | 100 | picofarads |
| d | 0.001 | 0.0037 | 0.0037 | 0.0037 | inches |
| K | 10,000 | 10,000 | 10,000 | 10,000 | |
| n | 2 | 2 | 3 | 4 | |

TABLE 1-continued

| dK = 10,000 | | | | | |
|---|---|---|---|---|---|
| S = | 0.000045 | 0.000165 | 0.000083 | 0.000055 | square inches |
| L = W = | 0.0067 | 0.0129 | 0.0091 | 0.0074 | inches |

$S = C*d/.224*K*(n-1)$

TABLE 2

| dK = 18,000 | | | | | |
|---|---|---|---|---|---|
| C | 100 | 100 | 100 | 100 | picofarads |
| d | 0.001 | 0.0037 | 0.0037 | 0.0037 | inches |
| K | 18,000 | 18,000 | 18,000 | 18,000 | |
| n | 2 | 2 | 3 | 4 | |
| S = | 0.000025 | 0.000092 | 0.000046 | 0.000031 | square inches |
| L = W = | 0.0050 | 0.0096 | 0.0068 | 0.0055 | inches |

$S = C*d/.224*K*(n-1)$

Figure 4:
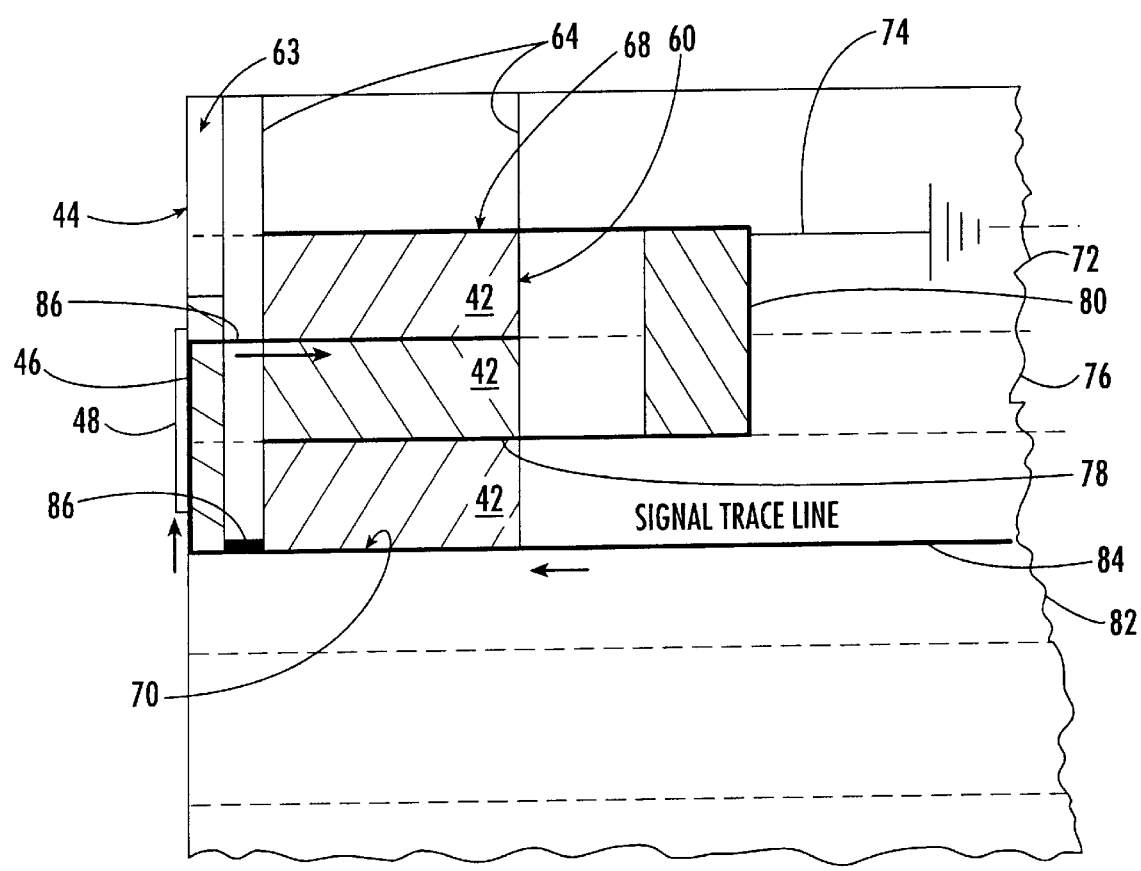
FIG. 4 is another schematic sectional view of a multi-chip module of the present invention and showing a via filled with high K dielectric material to form a decoupling/filter capacitor that is positioned adjacent a cut via and bondable edge.
Figure 5:
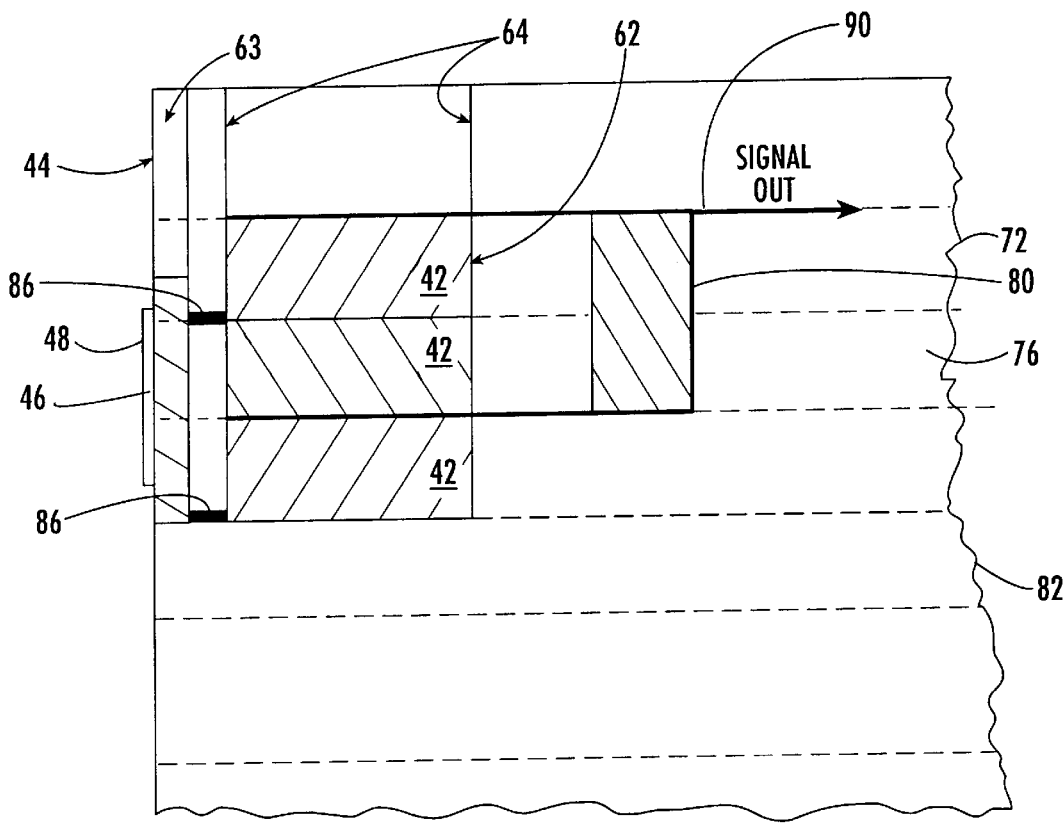
FIG. 5 is a schematic sectional view of a multi-chip module of the present invention similar to the structure shown in FIG. 4, but showing a capacitor formed as a DC blocking capacitor structure.

FIGS. 4 and 5 illustrate other embodiments of the present invention where a decoupling capacitor structure 60 (FIG. 4) is formed and in FIG. 5 where a DC blocking capacitor structure 62 is formed similar to that shown in FIG. 4 with variations concerning signal lines initially formed on the green tape ceramic sheets. In the description of the structures of FIGS. 4 and 5, like elements common to structures of FIGS. 2–5 retain common reference numerals.

As shown in FIG. 4, the substrate also includes a cut edge 44 that extends through a via 63 that has been filled with a conductive material such as the gold and glass binder. The via can be formed as described before. The cut edge 44 forms a bondable edge 46. Adjacent the cut edge 44, another via 64 has been formed and filled with high K dielectric material 42 to form a multilayer decoupling capacitor structure 60. In the embodiment shown in FIG. 4, the capacitive material fills the via for at least a plurality of substrate layers and defines the multilayer capacitor 60. In the present illustrated embodiment, three via substrate layers are filled with the capacitive material. It should be understood that the number of via substrate layers that are filled with the capacitive material varies depending on the design requirements of the capacitor. As illustrated, the capacitor 60 defines respective upper and lower portions 68,70 within the via 64. The top substrate layer 72 containing the via and dielectric material includes a ground line 74 that has been formed such as by standard printing techniques on the green tape ceramic sheets and engages the upper portion 68 of the formed capacitor. The second substrate layer 76 includes a trace 78 (or conduction path) that extends into the formed capacitor 66. A conductive via 80, such as a laser drilled hole that has been filled with the conductive material, connects the ground line 74 and the conductive trace 78. The lower substrate layer 82 on which the capacitor is mounted also includes a signal trace line 84 that has been formed such as by standard printing techniques on the green tape ceramic sheets.

As illustrated, the bondable edge 46 is electrically connected to the formed capacitor by conductor lines 86 and the entire structure is interdigitized to form a signal trace line 84 that extends from the signal trace line 84 into the cut edge and then back into the capacitor, as illustrated by the arrow. The ground line 74 connects into the capacitor by means of the conductive via into the capacitor as shown by the illustrated line. It is evident that the capacitor acts as a decoupling capacitor that can be used also as a filter.

The structure in FIG. 5 is similar to the capacitor structure shown in FIG. 4, except there is no signal trace line or ground line. A signal out line 90 formed as a trace has been printed on the upper substrate layer 72 and there is no signal trace line. It is evident that the capacitor in FIG. 5 forms a DC blocking capacitor structure that blocks DC current as necessary depending on the circuit in which the module is to be used.

It is evident that the present invention is now advantageous over the prior art devices used in discrete capacitors and other embedded capacitors because involved routing traces and attachment pads are no longer necessary. With the structure of the present invention, higher packaging densities can be realized and improved electrical performance is gained with the close proximity of the capacitor structure to the signal interface formed by the bondable edge.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A multi-chip module having an integral capacitor element comprising:
    a plurality of substrate layers forming a multi-chip module substrate;
    at least one via formed in the multi-chip substrate;
    a conductive material filling a portion of said via; and
    a dielectric capacitive material filling said via for said plurality of substrate layers and engaging said conductive material within said via to define a multilayer capacitor, wherein said substrate has a cut edge that extends through at least a portion of said via for exposing said conductive material that fills said via to define a bondable edge.

2. A multi-chip module according to claim 1, wherein said cut edge extends through said via off-center to aid in retaining said conductive material within said via.

3. A multi-chip module according to claim 1, wherein said cut edge extends through said capacitive material to form an exposed edge of said capacitive material.

4. A multi-chip module according to claim 3, and further comprising a cap structure positioned on the exposed edge of said capacitive material.

5. A multi-chip module according to claim 1, and further comprising a signal trace formed on one of said layers and engaging said conductive material within said via.

6. A multi-chip module according to claim 1, wherein said conductive material filling said via comprises a gold and glass binder.

7. A multi-chip module according to claim 1, wherein said plurality of substrate layers are formed from ceramic.

8. A multi-chip module according to claim 1, and further comprising a ground line formed on one of said plurality of substrate layers and engaging said capacitive material.

9. A multi-chip module according to claim 1, wherein said capacitive material comprises a high dielectric constant material.

10. A multi-chip module according to claim 9, wherein said high dielectric material is about 10,000 to about 20,000 constant.

11. A multi-chip module according to claim 9, wherein said high dielectric constant material has about 100,000 to about 200,000.

12. A multi-chip module according to claim 1, wherein the cut edge defining said bondable edge is about 8 mil square.

13. A multi-chip module having an integral capacitor element comprising:
    a plurality of substrate layers forming a multi-chip module substrate, said multi-chip module substrate having a cut edge;
    a via formed in the multi-chip module substrate adjacent the cut edge;
    a dielectric capacitive material forming at least two layers and filling said via for said plurality of substrate layers and defining a multilayer capacitor;
    means formed on said cut edge and defining a bondable edge;
    means electrically interconnecting said bondable edge and capacitive material; and
    means connecting said at least two layers of said dielectric capacitive material.

14. A multi-chip module according to claim 13, wherein said means connecting at least two layers further comprises a conductive via.

15. A multi-chip module according to claim 13, wherein said capacitor defines an upper and lower portion within said via.

16. A multi-chip module according to claim 15, and further comprising a signal trace formed on one of said plurality of substrate layers and connected to one of either said upper or lower portions of said capacitor to form a DC blocking capacitor structure.

17. A multi-chip module according to claim 15, and further comprising a ground line formed on one of said substrate layers and connected to one of either said upper or lower portions of said capacitor, and a signal trace formed on one of said substrate layers and engaging said bondable edge to define a decoupling capacitor structure.

18. A multi-chip module according to claim 13, and further comprising a post-fired bond pad formed on said bondable edge.

19. A multi-chip module according to claim 13, wherein said means formed on said cut edge and defining a bondable edge comprises a solid conductive via that has been cut to expose solid conductive material within said conductive via.

20. A multi-chip module according to claim 19, wherein said solid conductive via has been cut off-center to aid in retaining said conductive material within said conductive via.

21. A multi-chip module according to claim 19, wherein said conductive material filling said solid conductive via comprises a gold and glass binder.

22. A multi-chip module according to claim 13, and further comprising a signal trace formed on one of said substrate layers and engaging said bondable edge.

23. A multi-chip module according to claim 13, wherein said plurality of substrate layers are formed from ceramic.

24. A multi-chip module according to claim 13, and further comprising a ground line formed on one of said substrate layers and engaging said capacitive material.

25. A multi-chip module according to claim 13, wherein said capacitive material comprises a high dielectric constant material.

26. A multi-chip module according to claim 13, wherein said high dielectric constant material is about 10,000 to about 20,000.

27. A multi-chip module according to claim 13, wherein said high dielectric constant material is about 100,000 to about 200,000.

28. A multi-chip module according to claim 13, wherein said bondable edge is about 8 mil square.

29. A multi-chip module having an integral capacitor element comprising:

a plurality of substrate layers forming a multi-chip module substrate, said multi-chip module substrate having a cut edge;

means formed on said cut edge and defining a bondable edge surface;

a via formed in the multi-chip module substrate;

a dielectric capacitive material filling said via for said plurality of substrate layers and defining a multilayer capacitor;

and means positioned at said bondable edge and connecting said dielectric capacitive material and bondable edge.

30. A multi-chip module according to claim 29, wherein said via having said dielectric capacitive material is positioned at said cut edge, and including a conductive material filling at least a portion of said cut via to form said bondable edge, and said means connecting said dielectric capacitive material and bondable edge comprises a junction surface.

31. A multi-chip module according to claim 30, including a post-fired bond pad formed on the cut edge.

32. A multi-chip module according to claim 30, wherein said means formed on said cut edge and defining a bondable edge comprises a solid conductive via that has been cut to expose conductive material formed within said via.

33. A multi-chip module according to claim 32, wherein said solid conductive via has been cut off-center to aid in retaining said conductive material within said solid conductive via.

34. A multi-chip module according to claim 33, wherein said conductive material filling said via comprises a gold and glass binder.

35. A multi-chip module according to claim 29, wherein said capacitor defines an upper and lower portion within said via.

36. A multi-chip module according to claim 29, and further comprising a signal trace formed on one of said plurality of substrate layers and connected to said capacitor to form a DC blocking capacitor structure.

37. A multi-chip module according to claim 29, and further comprising a ground line formed on one of said substrate layers and engaging said capacitive material, and a signal trace formed on one of said substrate layers and engaging said bondable edge to define a decoupling capacitor structure.

38. A multi-chip module according to claim 29, wherein said cut edge extends through said capacitive material to form an exposed edge of said capacitive material.

39. A multi-chip module according to claim 38, wherein said cut edge extending through said capacitive material to form an exposed edge of said capacitive material includes a cap.

40. A multi-chip module according to claim 29, and further comprising a signal trace formed on one of said multi-chip substrate layers and engaging said bondable edge.

41. A multi-chip module according to claim 29, wherein said plurality of layers are formed from ceramic.

42. A multi-chip module according to claim 29, and further comprising a ground line formed on one of said substrate layers and engaging said capacitive material.

43. A multi-chip module according to claim 29, wherein said capacitive material comprises a high dielectric constant material.

44. A multi-chip module according to claim 43, wherein said high dielectric constant material is about 10,000 to about 20,000.

45. A multi-chip module according to claim 43, wherein said high dielectric constant material is about 100,000 to about 200,000.

46. A multi-chip module according to claim 43, wherein the cut edge defining said bondable edge is about 8 mil square.

* * * * *